(12) United States Patent
Sander et al.

(10) Patent No.: US 10,199,491 B2
(45) Date of Patent: Feb. 5, 2019

(54) VERTICAL TRANSISTOR WITH IMPROVED ROBUSTNESS

(71) Applicant: Infineon Technologies Austria AG, Villach (AT)

(72) Inventors: Rainald Sander, Munich (DE); Markus Winkler, Munich (DE); Michael Asam, Sainbach (DE); Matthias Stecher, Munich (DE)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 15/227,578

(22) Filed: Aug. 3, 2016

(65) Prior Publication Data

US 2016/0343850 A1 Nov. 24, 2016

Related U.S. Application Data

(62) Division of application No. 13/194,362, filed on Jul. 29, 2011, now Pat. No. 9,431,484.

(51) Int. Cl.
*H01L 29/78* (2006.01)
*H01L 29/40* (2006.01)
*H01L 29/10* (2006.01)
*H01L 29/06* (2006.01)

(52) U.S. Cl.
CPC ...... *H01L 29/7813* (2013.01); *H01L 29/0696* (2013.01); *H01L 29/1095* (2013.01); *H01L 29/407* (2013.01); *H01L 29/7805* (2013.01); *H01L 29/0634* (2013.01)

(58) Field of Classification Search
CPC .................. H01L 29/7827; H01L 29/1095
See application file for complete search history.

(56) References Cited

U.S. PATENT DOCUMENTS

| | | |
|---|---|---|
| 5,998,836 A | 12/1999 | Williams |
| 6,498,071 B2 | 12/2002 | Hijzen et al. |
| 6,975,004 B2 | 12/2005 | Sander |
| 7,897,461 B2 | 3/2011 | Takami |
| 2003/0107089 A1 | 6/2003 | Sander |
| 2006/0267090 A1 | 11/2006 | Sapp et al. |
| 2009/0072300 A1 | 3/2009 | Yamamoto et al. |
| 2009/0078994 A1 | 3/2009 | Takami |
| 2012/0049202 A1 | 3/2012 | Nakano |

FOREIGN PATENT DOCUMENTS

| | | |
|---|---|---|
| DE | 69617098 T2 | 4/2002 |
| DE | 10161125 C1 | 7/2003 |
| EP | 1037285 A1 | 9/2000 |

*Primary Examiner* — Tran Tran
(74) *Attorney, Agent, or Firm* — Slater Matsil, LLP

(57) ABSTRACT

A transistor is disclosed that includes a semiconductor body having a first horizontal surface. A drift region is arranged in the semiconductor body. A plurality of gate electrodes is arranged in trenches of the semiconductor body. The trenches have a longitudinal direction and extending parallel relative to each other. The longitudinal direction of the trenches extends in a first lateral direction of the semiconductor body. The body regions and the source regions are arranged between the trenches. The body regions are arranged between the drift region and the source regions in a vertical direction of the semiconductor body. In the first horizontal surface, the source regions and the body regions are arranged alternately in the first lateral direction. A source electrode is electrically connected to the source regions and the body regions in the first horizontal surface.

20 Claims, 3 Drawing Sheets

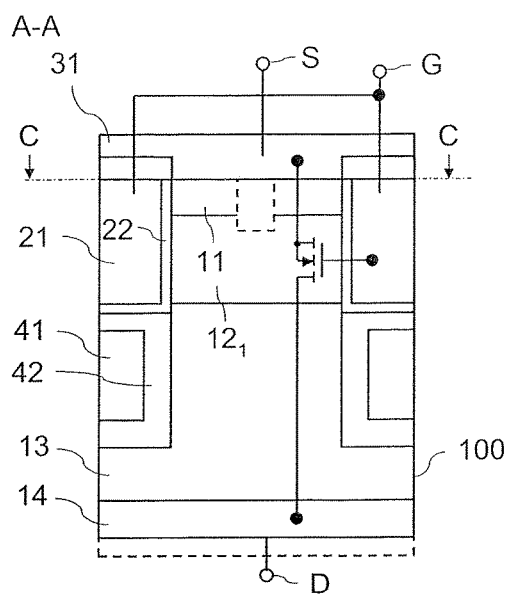
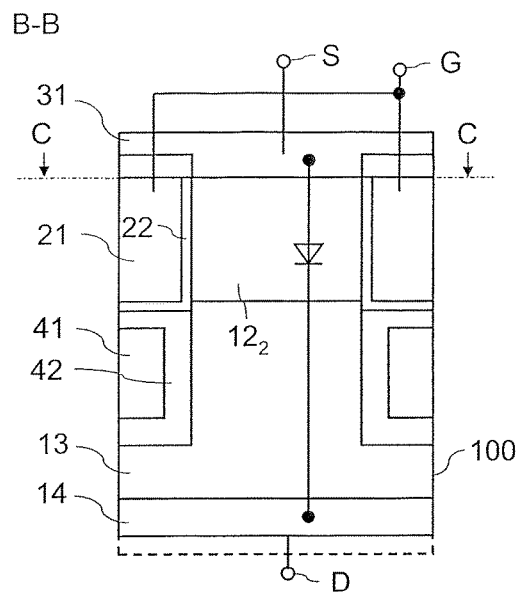
FIG 2A
FIG 2B
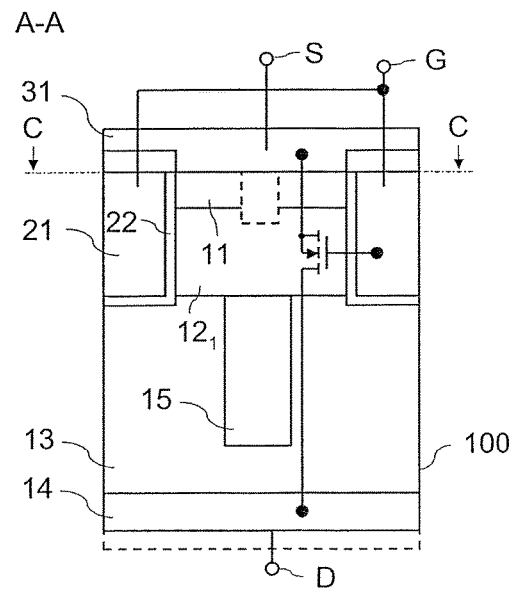
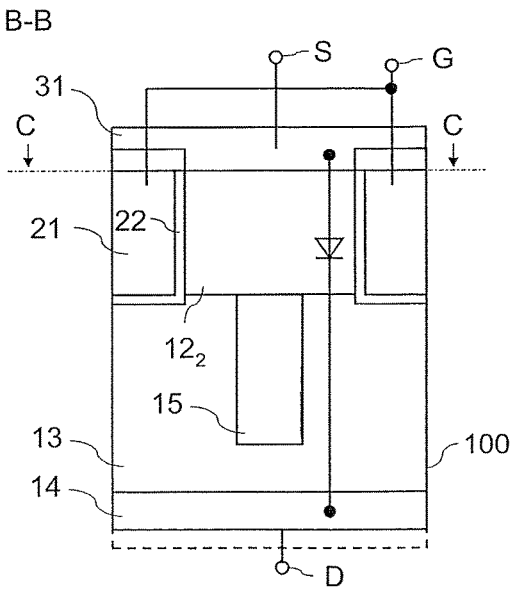
FIG 3A
FIG 3B

VERTICAL TRANSISTOR WITH IMPROVED ROBUSTNESS

CROSS-REFERENCE TO RELATED APPLICATIONS

This application is a Divisional of U.S. patent application Ser. No. 13/194,362 filed on Jul. 29, 2011, which application is hereby incorporated herein by reference.

TECHNICAL FIELD

Embodiments of the present invention relate to a vertical transistor, in particular, a vertical power MOSFET.

BACKGROUND

Transistors, such as power MOSFETs, are widely used as electronic switches for switching electrical loads, such as motors, lighting, and others, or as switches in switched mode power supplies, to mention only some possible applications. Power MOSFETs include a drift region between a body region and a drain region, where a PN junction is formed between the body region and the drift region. The MOSFET is switched off when a voltage is applied that biases the PN junction in a reverse direction, so that a depletion region is formed in the drift region. A doping concentration and a length of the drift region are two of several parameters that define a voltage blocking capability of the MOSFET. The voltage blocking capability is the maximum voltage that may be applied to the PN junction before an Avalanche breakthrough occurs. When an Avalanche breakthrough sets in a high current flows through the MOSFET in the reverse direction, this current causes the MOSFET to be heated.

Dependent on the specific type of the MOSFET, the voltage blocking capability can be between several by and up to several kilovolts (kV). Modern MOSFET device are capable of withstanding an Avalanche breakthrough for a while without being damaged or even destroyed. The robustness of a MOSFET is defined by the energy it may dissipate in the Avalanche breakthrough state without being damaged or destroyed.

There is a need to further improve the robustness of MOSFET devices.

SUMMARY

A first embodiment of the present invention relates to a transistor. The transistor includes a semiconductor body having a first horizontal surface, a drift region arranged in the semiconductor body, and a plurality of gate electrodes arranged in trenches of the semiconductor body. The trenches have a longitudinal direction and extend parallel relative to each other, where the longitudinal directions of the trenches extend in a first lateral direction of the semiconductor body. The transistor further includes body regions arranged between the trenches and source regions arranged between the trenches, where the body regions are arranged between the drift regions and the source regions in a vertical direction of the semiconductor body. In the first horizontal surface, source regions and body regions are arranged alternately in the first lateral direction, and a source electrode is electrically connected to the source regions and body regions in the first surface.

A second embodiment relates to a transistor. The transistor includes a semiconductor body having a first horizontal surface, a drift region arranged in the semiconductor body, and a plurality of gate electrodes arranged in trenches of the semiconductor body. The trenches have a longitudinal direction and extend parallel relative to each other, where the longitudinal directions of the trenches extend in a first lateral direction of the semiconductor body. The transistor further includes body regions arranged between the trenches, and source regions arranged between the trenches. The source regions extend to the first surface and form at least one source area divided into the source regions by the gate electrodes. The source area in the first surface is surrounded by a body area comprising a plurality of body regions extending to the first surface.

BRIEF DESCRIPTION OF THE DRAWINGS

Examples will now be explained with reference to the drawings. The drawings serve to illustrate the basic principle, so that only aspects necessary for understanding the basic principle are illustrated. The drawings are not to scale. In the drawings the same reference characters denote like signals and circuit components.

FIG. 2 (which includes FIGS. 2A and 2B) illustrates a second embodiment of a transistor implemented as a MOSFET;

FIG. 3 (which includes FIGS. 3A and 3B) illustrates a third embodiment of a transistor implemented as a MOSFET.

DETAILED DESCRIPTION OF ILLUSTRATIVE EMBODIMENTS

Figure 1A:
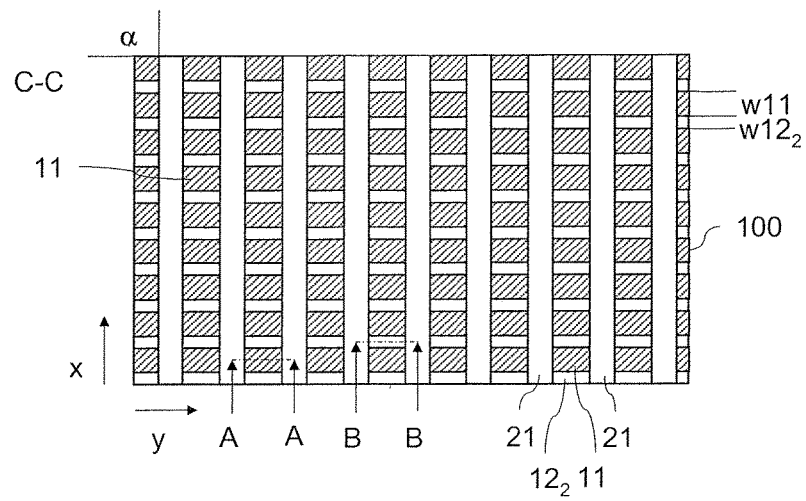
FIG. 1 (which includes FIGS. 1A-1C) illustrates a first embodiment of a transistor implemented as a MOSFET.
Figure 1B:
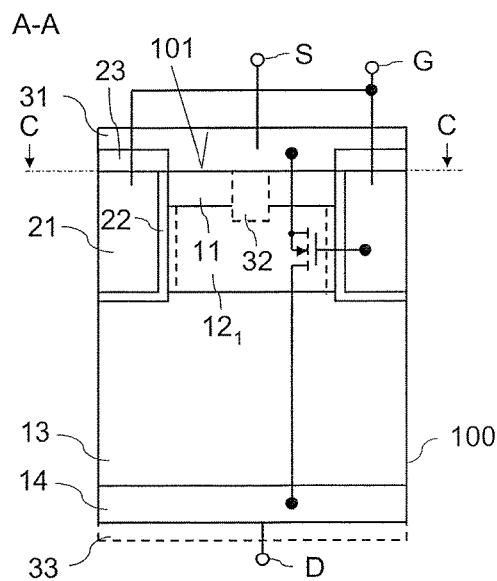
Figure 1C:
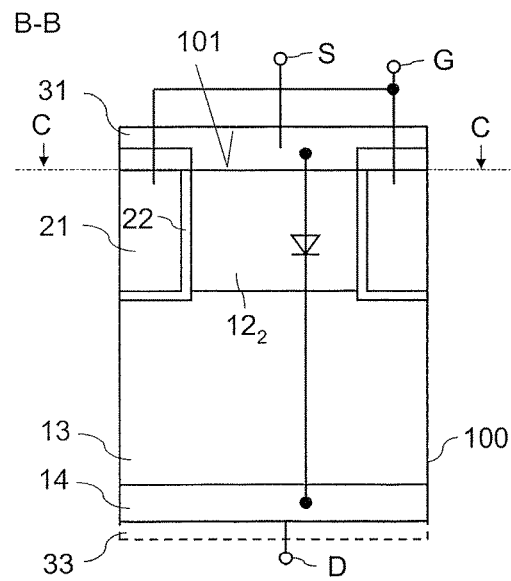

FIGS. 1A to 1C illustrate a first embodiment of a transistor implemented as a MOSFET. FIG. 1A illustrates a horizontal cross sectional view of a semiconductor body 100 in which active regions of the MOSFET are integrated. FIG. 1B illustrates a first vertical cross sectional view of a section of the MOSFET, and FIG. 1C illustrates a second vertical cross sectional view of a section of the MOSFET. FIG. 1A illustrates a horizontal cross sectional view in a horizontal section plane C-C illustrated in FIGS. 1B and 1C, FIG. 1B illustrates a vertical cross sectional view in a vertical section plane A-A illustrated in FIG. 1A, and FIG. 1C illustrates a vertical cross sectional view in vertical section plane B-B illustrated in FIG. 1A.

The MOSFET includes a plurality of gate electrodes 21 arranged in trenches of the semiconductor body 100. The trenches have a longitudinal direction and extend parallel relative to each other, where the longitudinal direction of the trenches extends in a first lateral direction x of the semiconductor body 100. Each gate electrode 21 is dielectrically insulated from regions of the semiconductor body 100 by a gate dielectric 22.

The MOSFET further includes source regions 11 and body regions $12_1$, $12_2$ arranged between neighboring gate electrodes 21. Referring to FIGS. 1B and 1C, the body regions $12_1$, $12_2$ adjoin a drift region 13. The drift region 13 is arranged below the body regions $12_1$, $12_2$ in a direction that runs perpendicular to a first surface 101 of the semiconductor body 100. The body regions $12_1$, $12_2$ and the drift region 13 form a PN-junction. The MOSFET further includes a drain region 14, where the drift region 13 is arranged between the drain region 14 and the body regions $12_1$, $12_2$. Referring to FIGS. 1B and 1C, the drain region 14 may adjoin the drift region 13. However, optionally, a field stop region (not illustrated) of the same doping type as the drift region 13, but more highly doped, can be arranged between the drift region 13 and the drain region 14. The drift region 13 and the drain region 14 have the same doping type, where the drain region 14 is more highly doped than the drift region 13. The specific resistance of the drain region 14 is, for example, in the range of between $10-3$ $\Omega \cdot cm$ (Ohm*cm) and $10-2$ $\Omega \cdot cm$, while the specific resistance of the drift region 13 is, for example, in the range of between $10-1$ $\Omega \cdot cm$ and $10$ $\Omega \cdot cm$, in particular between $10-1$ $\Omega \cdot cm$ and $1$ $\Omega \cdot cm$. The drain region 14 is connected to a drain terminal D. This drain terminal D can be formed by a drain electrode 33 (illustrated in dashed lines) connected to the drain region 14.

The gate electrodes 21 are arranged in trenches that extend into the semiconductor body 100 from the first surface 101 of the semiconductor body. The source regions 11 are arranged adjacent to the first surface 101 and adjoin the gate dielectrics 22. One body region $12_1$, $12_2$ arranged between two neighboring gate electrodes 21 has two body region sections, a first body region section $12_1$ arranged between source regions 11 and the drift regions 13, and a second body region section $12_2$ extending to the first surface 101 and arranged between the first surface 101 and the drift region 13. The second body region sections $12_2$ arranged between two gate electrodes 21 subdivide one source region 11 arranged between these two gate electrodes 21 into several source region sections 11. This is illustrated in FIG. 1A, where the source region sections 11 are illustrated as shaded regions. Referring to FIG. 1A, that shows a top view on the first surface 101 of the semiconductor body 100, source regions 11 and second body regions $12_2$ are arranged alternately in the first lateral direction x. The source regions 11 are stripe-shaped, where the individual "stripes" extend in a second lateral direction y that is different from the first lateral direction x. The stripe-shaped source regions 11 extend at least approximately parallel to each other, where between two neighboring source regions a second body region $12_2$ is arranged. In the second lateral direction y the stripe-shaped source regions 11 and the stripe-shaped second body regions $12_2$ are interrupted by the gate electrodes 21 with the gate dielectrics 22. It should be noted in this connection that in FIG. 1A only the gate electrodes 21 but not the gate dielectrics 22 are illustrated.

In the embodiment of FIG. 1A, an angle α between the first lateral direction x and the second lateral direction y is about 90°, which means that the stripe-shaped source regions 11 extend perpendicular to the gate electrodes 21. However, this is only an example. In general, the angle α between the first and second lateral directions x, y is between 30° and 90°, in particular, between 60° and 90°.

Referring to FIGS. 1B and 1C, the MOSFET further includes a source electrode 31 electrically contacting the source regions 11 and the second body regions $12_2$ in the first surface 101 and being electrically insulated from the gate electrodes 21 through an insulation layer 23. The source electrode 31 is connected to a source terminal S. This is schematically illustrated in FIGS. 1B and 1C. The individual gate electrodes 21 are electrically connected to a common gate terminal G. This connection is only schematically illustrated in FIGS. 1B and 1C. According to one embodiment (not illustrated) the MOSFET includes a further trench which extends perpendicular to the trenches with the gate electrodes 21 and in which a connection electrode is arranged that electrically connects the individual gate electrodes 21 which each other and that is connected to the gate terminal G.

In the MOSFET according to FIGS. 1A to 1C, the second body regions $12_2$ together with the drift region 13 and the drain region 14 form the body diode of the MOSFET. In a commonly known manner this body diode is obtained by electrically connecting the body region to the source electrode. A vertical cross section through those regions forming the body diode is illustrated in FIG. 1C. Referring to FIG. 1B, which shows a vertical cross section through the source region 11, the first body region $12_1$, the drift region 13 and the drain region 14, the source electrode 31 may optionally include an electrode section 32 extending through the source region 11 to the first body region $12_1$, so as to electrically connect the first body regions $12_1$ to the source electrode 31. Alternatively, a section of the first body region section $12_1$ may extend through the source region 11 to the first surface 101 and may be connected to the source electrode 31 in the region in the first surface.

The MOSFET can be implemented as an n-type MOSFET. In this case, the source regions 11, the drift region 13 and the drain region 14 are n-doped, while the body regions $12_1$, $12_2$ are p-doped. The MOSFET can also be implemented as a p-type MOSFET. In this case, the source region 11, the drift region 13 and the drain region 14 are p-doped, while the body region $12_1$, $12_2$ is n-doped. The MOSFET can be implemented as an enhancement MOSFET. In this case, the first body region $12_1$ adjoins the gate dielectrics 22, where the gate electrodes 21 extend from the source region 11 along the first body region sections $12_1$ to or into the drift region 13, and are electrically insulated from the source regions 11, the first body regions $12_1$ and the drift region 13 by the gate dielectrics 22. The MOSFET could also be implemented as a depletion MOSFET. In this case, a channel region (illustrated in dashed lines in FIG. 1B) of the same doping type as the source region 11 and the drift region 13 extends from the source region 11 to the drift region 13 along the gate dielectric 22.

The MOSFET can be operated like a conventional MOSFET. This will briefly be explained with reference to an n-type enhancement MOSFET, as an example. The MOSFET is switched on (in its on-state) when a positive voltage is applied between the drain terminal D and the source terminal S and when a gate potential is applied to the gate electrodes 21 that is suitable to generate an inversion channel along the gate dielectrics 22 between the source regions n and the drift region 13. The MOSFET is switched off (is in its off-state) when the inversion channel between the source regions 11 and the drift region 13 is interrupted by applying a suitable gate potential to the gate electrodes 21. An n-type MOSFET is switched on, when the gate potential is, for example, between about 5V and 15V above the source potential. The source potential is the electrical potential at the source terminal S. This type of MOSFET is switched off, when the gate potential is, for example, zero (0).

When the MOSFET is in its off-state and a positive voltage is applied between the drain terminal D and the source terminal S, the pn-junction between the body regions $12_1$, $12_2$ and the drift region 13 is reverse biased, so that a depletion region expands in the drift region 13. When the field strength of an electric field in the drift region 13 reaches a critical value (the critical electric field strength) an Avalanche breakthrough occurs which causes the MOSFET to conduct a current between the drain and the source terminals D, S.

It is desirable for the MOSFET to be capable of dissipating the energy that occurs in connection with an Avalanche breakthrough at least for a certain time without being destroyed. The robustness of a MOSFET is defined by the energy it is capable to dissipate in the Avalanche breakthrough state without being destroyed. The topology illustrated in FIGS. 1A to 1C with the longitudinal gate electrodes 21 having a first lateral direction x and with the longitudinal source regions 11 separated by the second body regions $12_2$, each extending in the second lateral direction y, helps to increase the robustness of the MOSFET. In this device heat or energy can be dissipated via the second body regions $12_2$ and the source electrode 31 better than through the first body regions $12_1$, the source regions 11 and the source electrode 31 for the following reason. The source region 11, the first body regions $12_1$ and the drift region 13 form a parasitic bipolar transistor, which is an npn transistor when the MOSFET is an n-type MOSFET. The first body region $12_1$ forms the base region of this parasitic transistor. This parasitic device, when activated at higher temperatures, will cause lower energy robustness.

The source regions 11 have an overall area size in the first surface 101, where this overall area size is the sum of the individual area sizes of the source regions 11. Equivalently, the second body region sections $12_2$ have an overall area size in the first surface 101. A ratio A11/A122 between the overall area size A11 of the source regions 11 and the overall area size A122 of the second body regions $12_2$ is, for example, between 1:10 (0.1) and 10:1(10). The robustness increases with an increase of the area size A12 of the second body region sections $12_2$ relative to the area size A11 of the source regions 11. However, an increase of the area size A122 of the second body region sections $12_2$ relative to the area size A11 of the source regions 11 also increases the on-resistance of the MOSFET. The ratio A11/A122 can be adjusted by, for example, varying a width w11 of the source regions 11 and/or a width w122 of the second body regions $12_2$ during the manufacturing process. The width w11 of the source regions 11 is their dimension in a direction perpendicular to the second lateral direction y, and a width w122 of the second body region sections $12_2$ is their dimension in the direction perpendicular to the second lateral direction y.

Additional means can be provided to increase the voltage blocking capability of the MOSFET. The voltage blocking capability of the MOSFET is defined by the voltage that has to be applied between the drain and source terminals D, S of the MOSFET in the off-state in order to cause an Avalanche breakthrough.

Referring to FIGS. 2A, 2B that each show a vertical cross sectional view of the MOSFET in the vertical section planes A-A and B-B, field electrodes 41 can be provided in the drift region 13. These field electrodes 41 are dielectrically insulated from the drift region 13 by a field electrode dielectric 42 that is usually thicker than the gate dielectric 22. The field electrodes 41 may either be connected to the gate terminal G or to the source terminal S. The electrical connection of the field electrodes 41 to one of these terminals is not explicitly illustrated in FIGS. 2A and 2B. Field electrodes 41 partly "compensate" doping charges in the drift region 13 when the MOSFET is in its off-state, so as to increase the voltage blocking capability and/or so as to allow a high doping concentration of the drift region 13 at a given voltage blocking capability. The operating principle of field electrodes in a drift region of a MOSFET is commonly known, so that no further explanations are required in this regard.

Referring to FIGS. 3A and 3B that each show a vertical cross sectional view of the MOSFET a vertical sections planes A-A and B-B, compensation regions 15 may be arranged in the drift region 13. The compensation regions 15 have a doping type that is complementary to the doping type of the drift region 13 which may be connected the body regions $12_1$, $12_2$. These compensation regions 15 serve to partly compensate doping charges of the drift region 13 when the MOSFET is in its off-state. The operating principle of compensation regions and the drift region of a MOSFET is commonly known, so that no further explanations are required in this regard.

In the embodiments explained before, the source regions 11 have a stripe-shaped geometry, where each "source stripe" is separated into a plurality of source sections by the gate electrodes 21 and the gate dielectrics 22. Between two neighboring source regions 11 second body regions $12_1$ are formed that extend to the first surface 101.

Figure 4A:
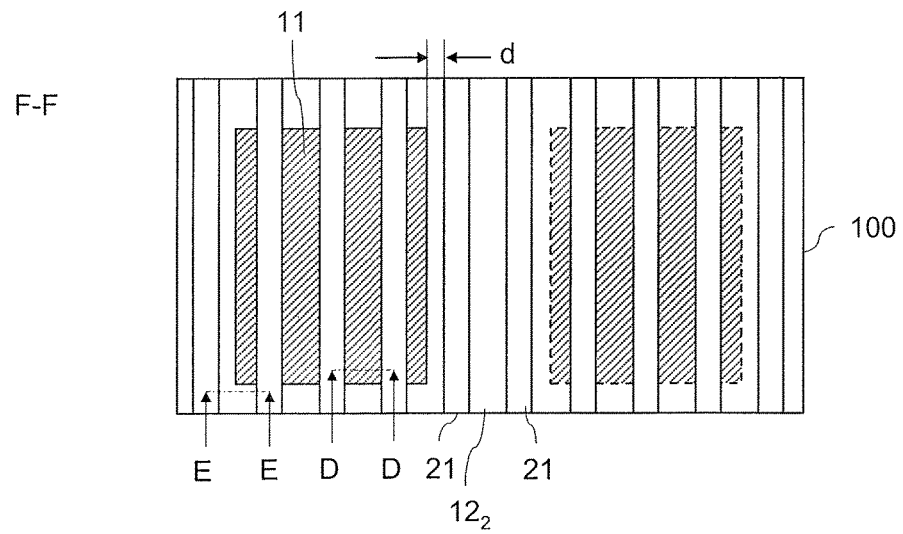
FIG. 4 (which includes FIGS. 4A to 4C) illustrates a further embodiment of a transistor implemented as a MOSFET.
Figures 4B, 4C:
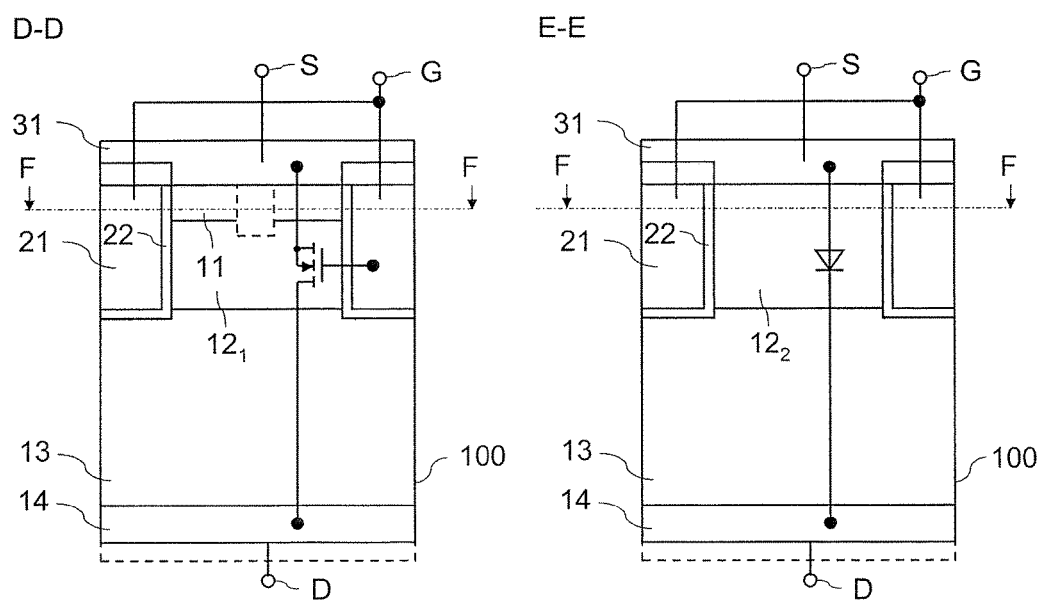

According to a further embodiment illustrated in FIGS. 4A to 4C, a source area that is formed by a plurality of source regions 11 extending to the first surface 101 is surrounded in the horizontal plane by a body area that is formed by a plurality of second body regions $12_2$ extending to the first surface 101. FIG. 4A illustrates a horizontal cross sectional view of the transistors device, and FIGS. 4B and 4C show vertical cross sectional views, where FIG. 4B shows a vertical cross sectional view in a region in which the device includes a source region 11, while FIG. 4C illustrates a vertical cross sectional view in a region in which the device includes the second body region $12_2$.

Referring to FIG. 4A, the source area with the source regions region 11 may have a rectangular geometry. However, this is only an example. The source area may be implemented with any other geometry as well, such as, e.g., a circular geometry or a polygonal geometry. The source area is divided into several sections (segments) by the gate electrodes 21, where these sections are source regions 11 arranged between two neighboring gate electrodes 21 and gate dielectrics 22. The body area with the second body regions $12_2$ surrounding the source area is also divided into several sections (segments) by the gate electrodes, where these sections are body regions formed between two neighboring gate electrodes 21 and gate dielectrics 22. Referring to FIG. 4A, there are semiconductor regions between two neighboring gate electrodes 21 in which second body regions $12_2$ but no source regions are arranged.

According to one embodiment, the source area in the second horizontal direction (which is the direction perpendicular to the longitudinal direction of the gate electrodes 21) ends between two neighboring gate electrodes 21. According to one embodiment, a junction between the source area ii and the second body region $12_2$ is in the middle between two trenches, so that d=0.5·w, where w is the distance (mesa width) between two neighboring gate electrodes 21, and d is the distance between the junction and the gate electrode 21 that is closest to the junction and in the body area. According to a further embodiment, the distance d is between 30% and 70% of the mesa width w.

Referring to FIGS. 4A and 4B, the source regions 11 and the second body regions $12_2$ are electrically connected to the source electrode 31. According to one embodiment, contacts that connect the source electrode 31 to the source terminal S are arranged above the second body regions $12_2$. These contacts are, for example, connected to the source terminal S via bond wires (not shown in FIGS. 4A to 4C).

Referring to FIG. 4A, the transistor device may include several source areas (one is illustrated in dashed lines in FIG. 4A) with source regions 11, each surrounded by a body area with second body regions $12_2$.

According to one embodiment, the at least one source area has a first surface area in the first surface and the body regions have a second surface area in the first surface, where a ratio between the first and second surface areas is between 10:1 and 1:10 or between 10:1 and 1:1.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A transistor comprising:
   a semiconductor body having a first horizontal surface that is a major surface of the semiconductor body in a plan view;
   a drift region arranged in the semiconductor body;
   a plurality of gate electrodes arranged in trenches of the semiconductor body, the trenches having a longitudinal direction and extending parallel relative to each other, the longitudinal direction of the trenches extending in a first lateral direction of the semiconductor body;
   body regions arranged between the trenches; and
   source regions arranged between the trenches, wherein the source regions extend to the first horizontal surface and form a source area that is divided into the source regions by the gate electrodes, wherein the source area in the first horizontal surface is surrounded by a body area comprising a plurality of body regions extending to the first horizontal surface, and wherein, in the first horizontal surface, at least one of the source regions comprises a rectangular source region and is surrounded on three sides in the first horizontal surface by at least one of the body regions in the plan view.

2. The transistor of claim 1, further comprising:
   gate dielectrics dielectrically insulating the gate electrodes from the semiconductor body; and
   a drain region, wherein the drift region is arranged between the drain region and the body regions.

3. The transistor of claim 1, wherein the source area has a rectangular, circular, or polygonal geometry.

4. The transistor of claim 1, wherein the source area is one of a plurality of source areas arranged distant to each other.

5. The transistor of claim 1,
   wherein the source area has a first surface area in the first horizontal surface and the body regions have a second surface area in the first horizontal surface, and
   wherein a ratio between the first surface area and the second surface area is between 10:1 and 1:10.

6. The transistor of claim 5, wherein the ratio is between 10:1 and 1:1.

7. The transistor of claim 1, wherein a distance between two neighboring gate electrodes is between 1 µm and 10 µm.

8. The transistor of claim 1, wherein, in the first horizontal surface, the source regions and the body regions are arranged alternately in the first lateral direction, wherein at least one of the body regions is arranged between two of the source regions in the first lateral direction and at least one of the source regions is arranged between two of the body regions in the first lateral direction.

9. The transistor of claim 1, wherein the source regions are stripe-shaped extending parallel to each other in a second lateral direction that is different from the first lateral direction, wherein one of the body regions is arranged between two neighboring stripe-shaped source regions to form a plurality of stripe-shaped second body regions, wherein in the second lateral direction, the stripe-shaped source regions and the stripe-shaped second body regions are interrupted by the plurality of gate electrodes.

10. The transistor of claim 1, wherein, in the first horizontal surface, each of the source regions is surrounded by either one of the body regions or one of the plurality of the gate electrodes, wherein at least two of the plurality of gate electrodes are directly disposed over each of the source regions.

11. A method of forming a transistor comprising:
    providing a semiconductor body having a first horizontal surface that is a major surface of the semiconductor body in a plan view;
    forming a drift region arranged in the semiconductor body;
    forming a plurality of gate electrodes arranged in trenches of the semiconductor body, the trenches having a longitudinal direction and extending parallel relative to each other, the longitudinal direction of the trenches extending in a first lateral direction of the semiconductor body;
    forming body regions arranged between the trenches;
    forming source regions arranged between the trenches;
    extending the source regions extend to the first horizontal surface and forming a source area that is divided into the source regions by the gate electrodes;

surrounding the source area in the first horizontal surface is by a body area comprising a plurality of body regions extending to the first horizontal surface; and in the first horizontal surface, surrounding at least one of the source regions comprising a rectangular source region on three sides in the first horizontal surface by at least one of the body regions in the plan view.

12. The method of claim 11, further comprising:

forming gate dielectrics dielectrically insulating the gate electrodes from the semiconductor body; and forming a drain region, wherein the drift region is arranged between the drain region and the body regions.

13. The method of claim 11, wherein the source area has a rectangular, circular, or polygonal geometry.

14. The method of claim 11, wherein the source area is one of a plurality of source areas arranged distant to each other.

15. The method of claim 11, wherein the source area has a first surface area in the first horizontal surface and the body regions have a second surface area in the first horizontal surface, and wherein a ratio between the first surface area and the second surface area is between 10:1 and 1:10.

16. The method of claim 15, wherein the ratio is between 10:1 and 1:1.

17. The method of claim 11, wherein a distance between two neighboring gate electrodes is between 1 μm and 10 μm.

18. The method of claim 11, wherein, in the first horizontal surface, the source regions and the body regions are arranged alternately in the first lateral direction, wherein at least one of the body regions is arranged between two of the source regions in the first lateral direction and at least one of the source regions is arranged between two of the body regions in the first lateral direction.

19. The method of claim 11, wherein the source regions are stripe-shaped extending parallel to each other in a second lateral direction that is different from the first lateral direction, wherein one of the body regions is arranged between two neighboring stripe-shaped source regions to form a plurality of stripe-shaped second body regions, wherein in the second lateral direction, the stripe-shaped source regions and the stripe-shaped second body regions are interrupted by the plurality of gate electrodes.

20. The method of claim 11, wherein, in the first horizontal surface, each of the source regions is surrounded by either one of the body regions or one of the plurality of the gate electrodes, wherein at least two of the plurality of gate electrodes are directly disposed over each of the source regions.

* * * * *